(12) United States Patent
Ferré Fàbregas et al.

(10) Patent No.: US 11,322,930 B1
(45) Date of Patent: May 3, 2022

(54) ELECTRICAL SYSTEM INCLUDING A POWER DISTRIBUTION CIRCUIT

(71) Applicant: Lear Corporation, Southfield, MI (US)

(72) Inventors: Antoni Ferré Fàbregas, Valls (ES); Anas Chib, Rabat Salé-Sala el Jadida (MA); Ali Enaji, Rabat Salé-Sala el Jadida (MA); Carlos Fernandez Pueyo, Valls (ES); Ignacio Molinero Horno, Valls (ES); Cristina Sole Bundo, Valls (ES)

(73) Assignee: Lear Corporation, Southfield, MI (US)

( * ) Notice: Subject to any disclaimer, the term of this patent is extended or adjusted under 35 U.S.C. 154(b) by 7 days.

(21) Appl. No.: 17/075,019

(22) Filed: Oct. 20, 2020

(51) Int. Cl.
*H02H 7/22* (2006.01)
*G01R 31/327* (2006.01)
*H02H 1/00* (2006.01)

(52) U.S. Cl.
CPC ........... *H02H 7/22* (2013.01); *G01R 31/3277* (2013.01); *H02H 1/0007* (2013.01)

(58) Field of Classification Search
CPC .... B60L 1/02; B60L 2210/30; B60L 2210/40; B60L 2240/36; B60L 2240/525; B60L 2240/526; B60L 2240/529; B60L 2240/545; B60L 2240/547; B60L 3/003; B60L 3/0038; B60L 3/0069; B60L 3/04; B60L 50/15; B60L 50/61; B60L 50/66; B60L 53/122; B60L 53/124; B60L 53/126; B60L 53/30; B60L 53/305; B60L 53/38; B60L 53/62; B60L 53/65; B60L 55/00; B60R 16/0231; B60R 16/03; B60R 25/045; G01R 1/0458; G01R 31/3277; H02H 1/0007; H02H 11/00; H02H 3/00; H02H 3/08; H02H 3/085; H02H 3/087; H02H 3/10; H02H 5/00; H02H 5/04; H02H 5/041; H02H 5/042; H02H 5/043; H02H 5/044;

(Continued)

(56) References Cited

U.S. PATENT DOCUMENTS 7,304,828 B1 12/2007 Shvartsman
7,742,273 B1 6/2010 Shvartsman et al.

(Continued)

FOREIGN PATENT DOCUMENTS

WO WO-2010045836 A1 * 4/2010 ............. G06F 1/263
WO WO2021185099 A1 * 9/2021 ............. G01R 31/28

*Primary Examiner* — Jared Fureman
*Assistant Examiner* — Nicolas Bellido
(74) *Attorney, Agent, or Firm* — Fishman Stewart PLLC

(57) ABSTRACT

An electrical system may include an ECU and a power distribution circuit that may include a first portion and a second portion. The first portion may be configured to combine a first power input and a second power input into a power output. The second portion may be configured to provide the combined power output to a plurality of loads. The first portion may include a first section, a second section, and an output section. The output section may be connected to the second portion. The first section and the second section may be connected in parallel to the output section. The first section may include a first semiconductor device and a first switch disposed in series. The second section may include a second semiconductor device and a second switch disposed in series. The ECU may be configured to detect and mitigate a thermal hazard in the power distribution circuit.

20 Claims, 8 Drawing Sheets

(58) Field of Classification Search
CPC ........ H02H 5/045; H02H 5/046; H02H 5/047;
H02H 5/048; H02H 7/0852; H02H 7/20;
H02H 7/22; H02H 9/02; H02H 9/04;
H02H 9/041
See application file for complete search history.

(56) References Cited

U.S. PATENT DOCUMENTS

| | | | |
|---|---|---|---|
| 8,412,966 | B2 | 4/2013 | Tofigh et al. |
| 9,061,592 | B2 | 6/2015 | Meng |
| 2005/0253458 | A1* | 11/2005 | Omae ................... H01M 16/00 307/10.1 |
| 2010/0026244 | A1* | 2/2010 | Iida ......................... B66B 5/027 320/134 |
| 2013/0262003 | A1 | 10/2013 | Simper et al. |
| 2015/0295448 | A1* | 10/2015 | Sugeno ................... B60L 58/32 701/22 |
| 2019/0052073 | A1* | 2/2019 | Stanculescu ........... H02H 3/085 |

* cited by examiner

ELECTRICAL SYSTEM INCLUDING A POWER DISTRIBUTION CIRCUIT

TECHNICAL FIELD

The present disclosure generally relates to an electrical system including a power distribution circuit and one or more electrical components.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical systems include components that may fail during operation. These faulty components may overheat and/or cause other components to overheat thereby producing a thermal hazard in the electrical system. The electrical system may need to be shut off and/or disabled in the event of a thermal hazard to prevent damage from occurring to the electrical system and/or to ensure safety. Disabling the electrical system may be undesirable and/or problematic in some situations. For example, when the electrical system is part of a vehicle, disabling the electrical system may require that the user cease operation of the vehicle.

There is a desire for solutions/options that minimize or eliminate one or more challenges or shortcomings of electrical systems for vehicles. The foregoing discussion is intended only to illustrate examples of the present field and is not a disavowal of scope.

SUMMARY

In embodiments, an electrical system may include a power distribution circuit and an electronic control unit (ECU) connected to the power distribution circuit. A power distribution circuit may include a first portion and a second portion. The first portion may be configured to combine a first power input and a second power input into a combined power output. The second portion may be configured to provide the combined power output to a plurality of loads. The first portion of the power distribution circuit may include a first section, a second section, and an output section. The output section may be connected to the second portion. The first section, the second section, and the output section may be connected to one another such that the first section and the second section are connected in parallel. The first section may include a first semiconductor device and a first switch disposed in series. The second section may include a second semiconductor device and a second switch disposed in series. The ECU may be configured to control the power distribution circuit to detect and mitigate a thermal hazard in the power distribution circuit.

With examples, a method of operating an electrical system may be described. The electrical system may include a power distribution circuit having a first portion. The first portion may include a first section, a second section, and an output section. The first section, the second section, and the output section may be connected to one another such that the first section and the second section are connected in parallel. The first section may include a first semiconductor device and a first switch arranged in series. The second section may include a second semiconductor device and a second switch arranged in series. The method may include measuring a first current of the first section and a second current of the second section. The method may also include calculating an expected first current of the first section and an expected second current of the second section. The method may further include determining whether a thermal hazard is present in at least one of the first section and the second section based on the measured first current, the expected first current, the measured second current, and the expected second current. Additionally, the method may include mitigating the thermal hazard.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
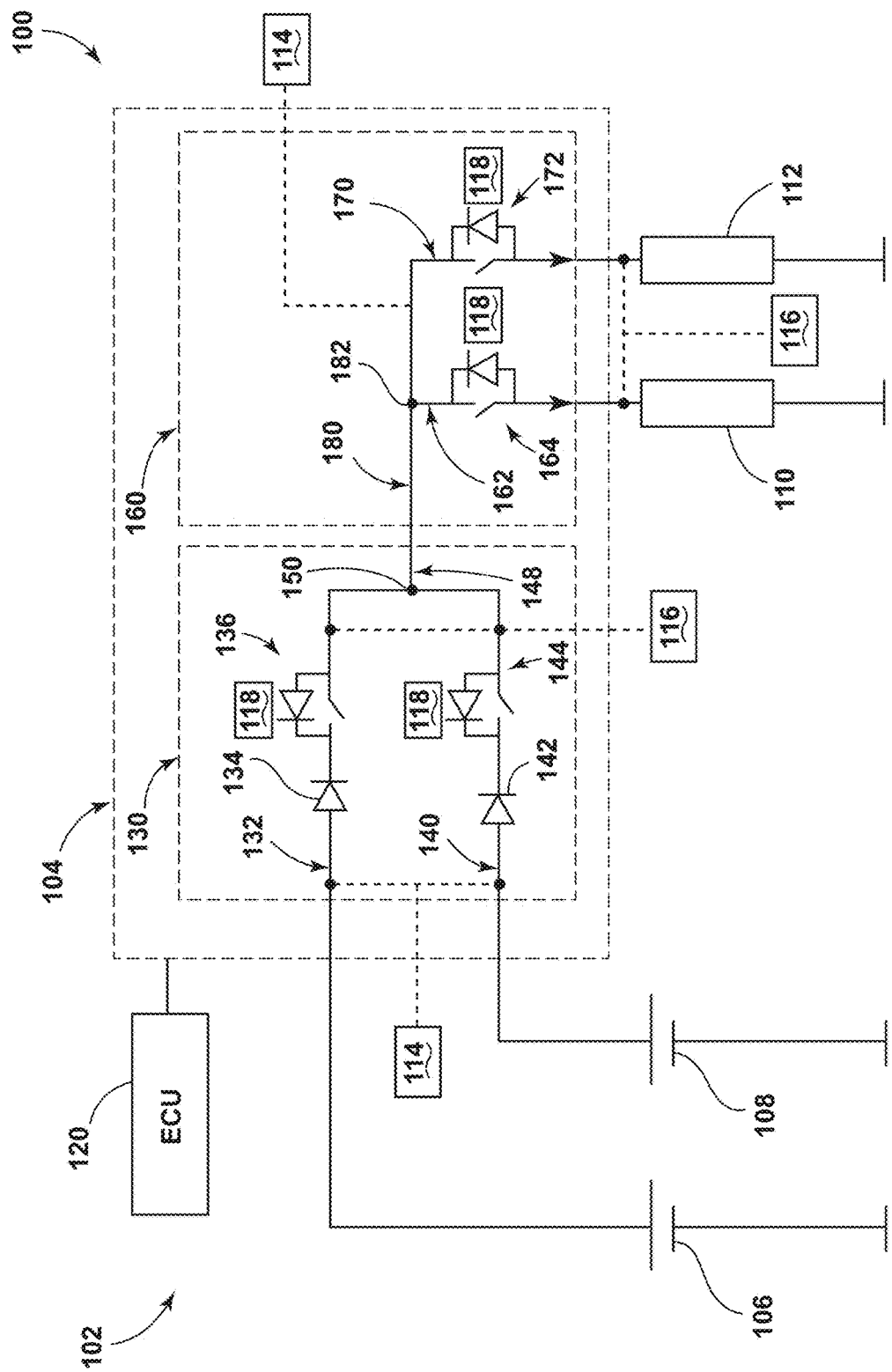
FIG. 1 is a diagram of an embodiment of an electrical system according to teachings of the present disclosure.
Figure 2:
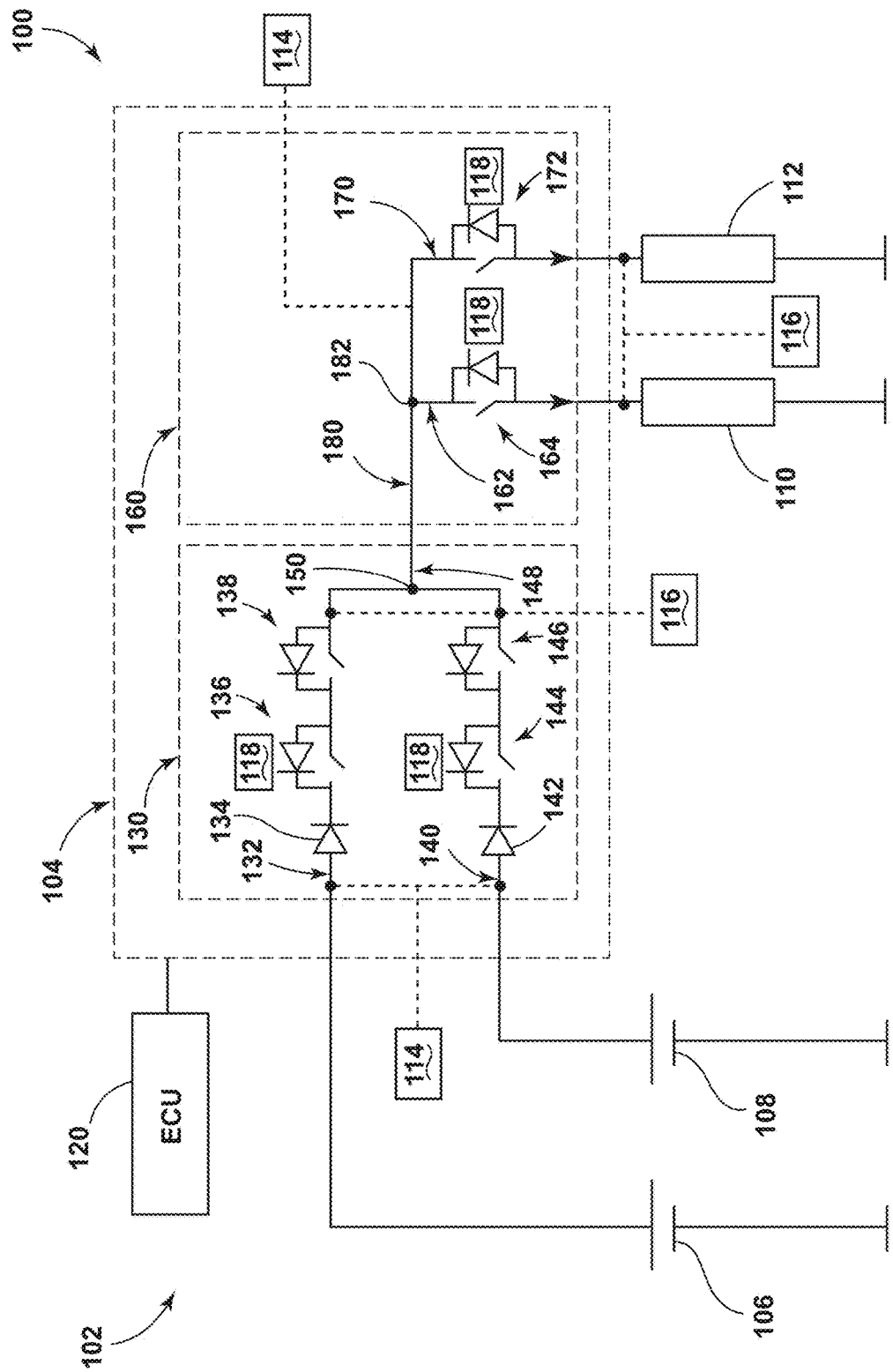
FIG. 2 is a diagram of an embodiment of an electrical system according to teachings of the present disclosure.

In embodiments, such as generally illustrated in FIGS. 1 and 2, a vehicle 100 may include an electrical system 102. An electrical system 102 may include a power distribution circuit 104 (e.g., a smart power distribution module or SPDM) and/or one or more electrical components (e.g., diodes, switches, resistors, sensors, etc.). The electrical system 102 may include one or more power sources 106, 108 (e.g., batteries, capacitors, transformers, circuits, etc.). The electrical system 102 may include one or more loads 110, 112 (e.g., outputs, motors, actuators, etc.). The power distribution circuit 104 may be connected to the power sources 106, 108 and/or the loads 110, 112. In some embodiments, the power sources 106, 108 and the loads 110, 112 may be connected to one another via the power distribution circuit 104.

With embodiments, such as generally illustrated in FIGS. 1 and 2, a power distribution circuit 104 may include a first portion 130 and/or a second portion 160. The first portion 130 and the second portion 160 may be connected to one another.

In embodiments, such as generally illustrated in FIGS. 1 and 2, a first portion 130 may include one or more sections, such as a first section 132, a second section 140, and/or an output section 148. The first section 132, the second section 140, and/or the output section 148 may be connected to one another at a node 150 (e.g., a point, intersection, junction, etc.). The first section 132 and the second section 140 may be connected in parallel. The first section 132 and/or the second section 140 may be connected to one or more of the power sources 106, 108. In some embodiments, the first section 132 may be connected to a first power source 106 at one end and to the second section 140, the output section 148, and/or a node 150 at another end. The second section 140 may be connected to a second power source 108 at one end and to the first section 132, the output section 148, and/or a node 150 at another end. The output section 148 may be connected to the second portion 160 (e.g., to an input section 180 of the second portion 160) at one end, and may be connected to the first section 132, the second section 140, and/or a node 150 at another end.

In embodiments, such as generally illustrated in FIGS. 1 and 2, a first portion 130 may be configured as a power multiplexer. A first portion 130 may be configured to receive a first power input from a first power source 106 via a first section 132, receive a second power input from a second power source 108 via a second section 140, combine the first power input and the second power input to form a combined power output (e.g., at a node 150 where the first section 132 and the second section 140 are connected to one another), and/or provide the combined power output to another system, component, assembly, etc. (e.g., a second portion 160) via an output section 148.

With embodiments, a first section 132 may include one or more electrical components (e.g., diodes, switches, metal oxide semiconductor field effect transistors (MOSFETS), resistors, sensors, transistors, transformers, etc.) 134, 136, 138 that may be connected in series and/or in parallel. A first section 132 may, for example and without limitation, include one or more semiconductor devices 134 (e.g., a diode, an ideal diode, a MOSFET, etc.) and/or one or more switches 136, 138 (e.g., a MOSFET switch). A semiconductor device 134 may include a diode and may be referred to as a first diode 134 herein, but is not limited to a diode.

In embodiments, such as generally illustrated in FIG. 1, a first section 132 may include a first diode 134 and a first switch 136 connected in series. A first terminal/inlet of the first diode 134 may be connected to the first power source 106. A second terminal/outlet of the first diode 134 may be connected to a first terminal/inlet of the first switch 136. A second terminal/outlet of the first switch 136 may be connected to the second section 140, the output section 148, a node 150, and/or another electrical component (e.g., a switch, a diode, etc.).

With embodiments, such as generally illustrated in FIG. 2, a first section 132 may include a first diode 134, a first switch 136, and a third switch 138 connected in series. An inlet of the first diode 134 may be connected to the first power source 106. An outlet of the first diode 134 may be connected to the inlet of the first switch 136. An outlet of the first switch 136 may be connected to an inlet of the third switch 138. An outlet of the third switch 138 may be connected to the second section 140, the output section 148, a node 150, and/or another electrical component (e.g., a switch, a diode, etc.).

In embodiments, such as generally illustrated in FIGS. 1 and 2, a second section 140 may include one or more electrical components 142, 144, 146 (e.g., ideal diodes, switches, MOSFETS, resistors, sensors, transistors, transformers). A second section 140 may be configured and/or structured in similar manner to the first section 132 and may include a second semiconductor device 142, a second switch 144, and/or a fourth switch 146. A second semiconductor device 142 may include a diode and may be referred to as a second diode 142 herein, but is not limited to a diode.

With embodiments, such as generally illustrated in FIGS. 1 and 2, a second portion 160 may be configured to facilitate distribution of a combined power output of the first portion to one or more loads 110, 112. A second portion 160 may include one or more sections, such as a first distribution section 162, a second distribution section 170, and/or an input section 180. The first distribution section 162, the second distribution section 170, and/or the input section 180 may be connected to one another at a node 182. The first distribution section 162 and the second distribution section 170 may be connected in parallel to the input section 180. The first distribution section 162 and/or the second distribution section 170 may be connected to one or more of the loads 110, 112. For example and without limitation, the first distribution section 162 may be connected to a first load 110 at one end and to the second distribution section 170, the input section 180, and/or a node 182 at another end. The second distribution section 170 may be connected to a second load 112 at one end and to the first distribution section 162, the input section 180, and/or a node 182 at another end. The input section 180 may be connected to the first portion 130 (e.g., the output section 148 of the first portion 130) at one end, and may be connected to the first distribution section 162, the second distribution section 170, and/or a node 182 at another end.

In embodiments, such as generally illustrated in FIGS. 1 and 2, a first distribution section 162 may include one or more electrical components (e.g., diodes, switches, resistors, sensors, transistors, transformers, etc.) 164 arranged in series and/or in parallel. In some examples, a first distribution section 162 may include a first distribution switch 164. An inlet of the first distribution switch 164 may be connected to the second distribution section 170, the input section 180, and/or a node 182. An outlet of the first distribution switch 164 may be connected to the first load 110. Additionally and/or alternatively, a first distribution section 162 may be configured and/or structured in a similar manner to the first section 132 of the first portion 130, and may include one or more diodes and/or one or more switches.

With embodiments, such as generally illustrated in FIGS. 1 and 2, a second distribution section 170 may include one or more electrical components 172 (e.g., diodes, switches, resistors, sensors, etc.) arranged in series and/or in parallel. A second distribution section 170 may be configured and/or structured in a similar manner to the first distribution section 162 and may include a second distribution switch 172. An inlet of the second distribution switch 170 may be connected to the first distribution section 162, the input section 180, and/or a node 182. An outlet of the second distribution switch 170 may be connected to the second load 112. Additionally and/or alternatively, a second distribution section 170 may be configured and/or structured in a similar manner to the second section 140 of the first portion 130, and/or may include one or more diodes and/or one or more switches.

In embodiments, such as generally illustrated in FIGS. 1 and 2, an electrical system 102 may include one or more voltage sensors 114 or other mechanisms/devices configured to sense, measure, and/or detect a voltage (e.g., voltage meter, etc.). One or more voltage sensors 114 may detect and/or measure (i) a first voltage of the first section 132, such as between the first power source 106 and the first diode 134, (ii) a second voltage of the second section 140, such as between the second power source 108 and the second diode 142, and/or (iii) an output voltage (e.g., a voltage of the output section 148, a voltage of the first portion 130, a voltage of the first distribution section 162, and/or a voltage of the second distribution section 170).

In examples, such as generally illustrated in FIGS. 1 and 2, an electrical system 102 may include one or more current sensors 116 or other mechanisms/devices configured to sense, measure, and/or detect an electrical current (e.g., ammeter, etc.). One or more current sensors 116 may detect and/or measure (i) a first current of the first section 132, such at or about a point and/or node disposed between the output section 148 and the first switch 136 or the third switch 138, (ii) a second current of the second section 140, such as at or about a point and/or node disposed between the output section 148 and the second switch 144 or the fourth switch 146, (iii) a first distribution current of the first distribution section 162, such as at or about a point and/or node disposed between the first distribution switch 164 and the first load 110, and/or (iv) a second distribution current of the second distribution section 170, such as at or about a point and/or node disposed between the second distribution switch 172 and the second load 112.

With embodiments, such as generally illustrated in FIGS. 1 and/or 2, an electrical system 102 may include one or more temperature sensors 118 or other mechanisms/devices configured to sense, measure, and/or detect a temperature. One or more temperature sensors 118 may detect (i) a first temperature that may be associated with one or more electrical components of the first section 132 (e.g., the first diode 134, the first switch 136, and/or the third switch 138), (ii) a second temperature that may be associated with one or more electrical components of the second section 140 (e.g., the second diode 142, the second switch 144, and/or the fourth switch 146), (iii) a first distribution temperature that may be associated with one or more electrical components of the first distribution section 162 (e.g., the first distribution switch 164), and/or (iv) a second distribution temperature that may be associated with one or more electrical components of the second distribution section 170 (e.g., the second distribution switch 172).

In embodiments, during operation, various electrical components (e.g., diodes 134, 142, and/or switches 136, 138, 144, 146, 164, 172) of the electrical system 102 may fail for a variety of reasons and, in at least some cases, may short-circuit in a resistive mode (e.g., failed in a resistive short-circuit mode where it behaves as a resistor. Additionally, when some components short-circuit in a resistive mode, it may not be possible to directly shut off and/or disconnect them, which may cause the faulty component to overheat and/or may cause other components to overheat, which may result in and/or create a thermal hazard in the electrical system 102.

In embodiments, such as generally illustrated in FIGS. 1 and 2, an electrical system 102 may include an electronic control unit (ECU) 120 that may be operatively and/or communicatively connected to the power distribution circuit 104, some or all of the sensors 114, 116, 118, and/or some or all of the electrical components (e.g., diodes 134, 142, switches 136, 138, 144, 146, 164, 172, power sources 106, 108, and/or loads 110, 112) of the electrical system 102. The ECU 120 may be configured to operate the electrical system 102, such as according to a method 300 and/or to detect and/or mitigate thermal hazards. The ECU 120 may be configured to detect if a thermal hazard is present in the electrical system 102, to detect any components (e.g., diodes 134, 142, and/or switches 136, 138, 144, 146, 164, 172) in the electrical system 102 that are faulty and/or have short-circuited in a resistive mode, and/or to isolate any faulty components in the electrical system 102. For example, the ECU 120 may be configured to mitigate (e.g., reduce, remove, overcome, address, etc.) a thermal hazard in the electrical system 102 and/or enable operation of the electrical system 102 to safely continue operation (e.g., of a vehicle) in a failsafe mode. The ECU 120 may, additionally or alternatively, be configured to control one or more other vehicle systems of the vehicle 100 and/or movement of the vehicle 100. The ECU 120 may, additionally and/or alternatively, include at least a portion of the power distribution circuit 104.

Figure 3:
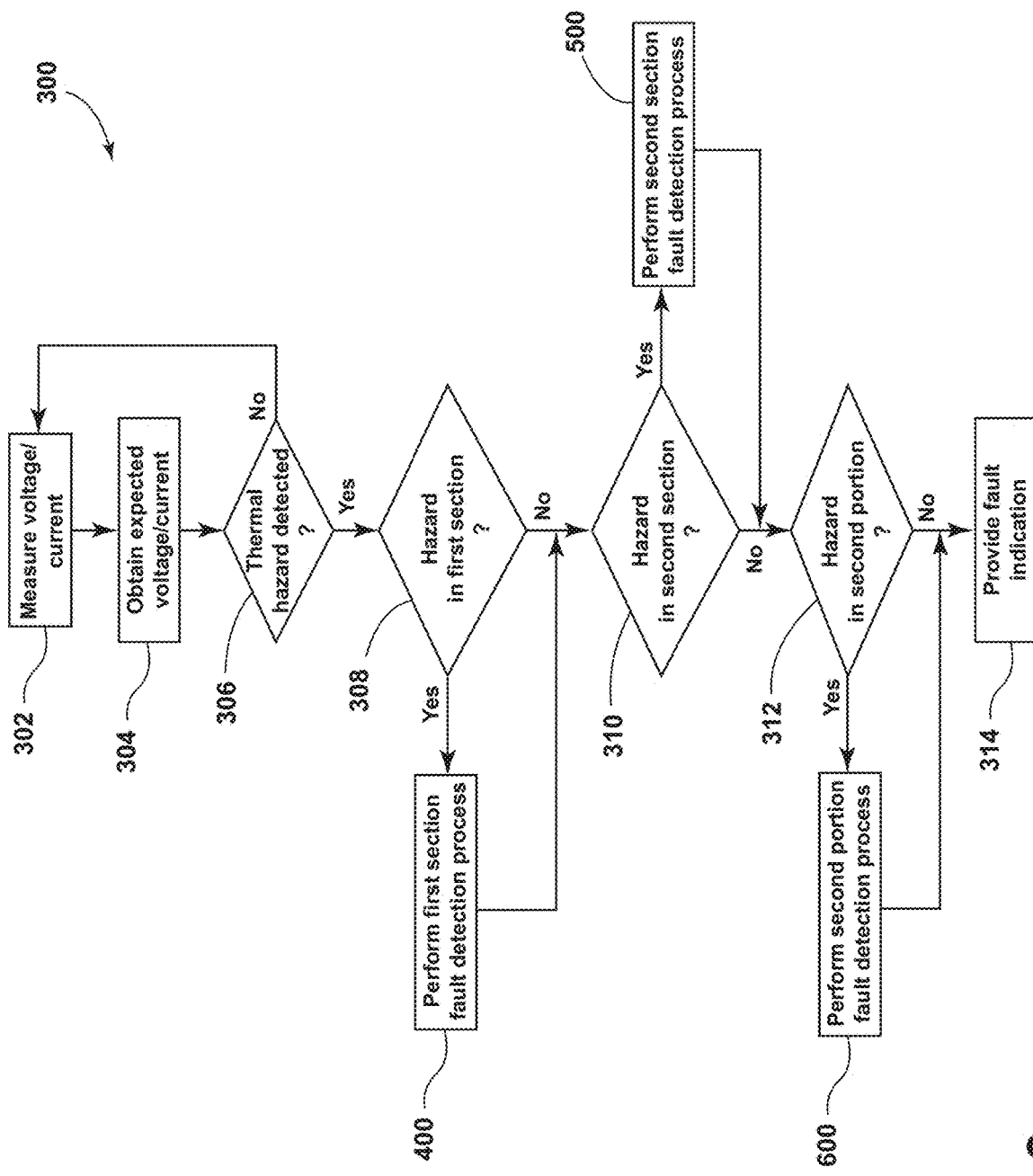
FIG. 3 is a flowchart generally illustrating an embodiment of a method for operating an electrical system according to teachings of the present disclosure.

Referring now to FIG. 3, illustrated is an embodiment of a method 300 of operating an electrical system 102. At block 302, the voltage sensors 114 and/or the current sensors 116 may sense (e.g., measure, detect, monitor, etc.) a voltage and/or current of one or more portions 130, 160 and/or sections 132, 140, 148, 162, 170, 180 of the electrical system 102.

At block 304, an expected voltage and/or an expected current of the first section 132, the second section 140, the output section 148, the input section 180, the first distribution section 162, and/or the second distribution section 170 may be obtained (e.g., determined, received from an external source, accessed in an associated electronic memory, etc.) via the ECU 120. The expected values may, for example, be based, at least in part, on predetermined values, and/or one or more of the measured voltages and/or the measured currents from block 302 (e.g., output currents/voltages from the power sources 106, 108).

At block 306, the ECU 120 may determine if a thermal hazard is present in the electrical system 102. A thermal hazard may be caused by a variety of different circumstances and may occur at a variety of different locations. For example, a faulty, malfunctioning, and/or defective component in the electrical system 102 may create and/or become a thermal hazard.

In embodiments, the ECU 120 may compare one or more of the measured voltages to the corresponding expected voltage to determine a voltage differential and/or may compare one or more of the measured currents to the corresponding expected current to determine a current differential, such as to determine if a thermal hazard is present. The ECU 120 may, for example, determine a thermal hazard is present (or predict a thermal hazard) if the voltage differential and/or the current differential is greater than a threshold (e.g., if the measured voltage and/or the measured current is too high or too low).

With embodiments, determining a current differential may include determining if there is a current imbalance relative to an expected current balance. For example, the ECU 120 may determine if the first current of the first section 132 and the second current of the second section 140 are each within a threshold of a percentage (e.g., 50% for two sections) of a total current output of the first portion 130 and/or of each other. Additionally or alternatively, the ECU 120 may determine if the first distribution current of the first distribution section 162 and the second distribution current of the second distribution section 170 of the second portion 160 are within a threshold range of a total current input of the second portion 160 and/or each other.

If the voltage differential and/or the current differential is within an acceptable threshold/tolerance range, the ECU 120 may determine that a thermal hazard is not present and the method 300 may return to block 302. With embodiments, the ECU 120 may be configured to routinely and/or continuously monitor the voltages and/or the currents within the electrical system 102, such as to facilitate efficient detection of any thermal hazard (e.g., monitoring may be conducted even when no thermal hazard is present and/or detected in the electrical system 102). With some embodiments, an ECU 120 may determine that a thermal hazard is not present only when the voltage differential, the current differential, and/or the temperature for each portion 130, 160 and/or each section 132, 140, 148, 162, 170, 180 are within a respective acceptable threshold/tolerance range.

In embodiments, if the ECU 120 determines that a voltage differential and/or a current differential is not within an acceptable threshold/tolerance range, the ECU 120 may determine that a thermal hazard is present. The voltage differential and/or the current differential may fall outside of the acceptable tolerance range for a variety of different reasons, such as failure of one or more of the components 132, 142, 136, 138, 144, 146, 164, 172 of the electrical system 102.

If the ECU 120 determines that a thermal hazard is present, the ECU 120 may determine the location of the thermal hazard, such as based on which portion 130, 160 and/or section 132, 140, 148, 162, 170, 180 has a voltage differential and/or a current differential outside of the acceptable tolerance range. For example, the ECU 120 may determine that the thermal hazard is present in (i) the first section 132 when the voltage differential and/or the current differential of the first section 132 is outside of the acceptable tolerance range, (ii) the second section 140 when the voltage differential and/or the current differential of the second section 140 is outside of the acceptable tolerance range, and/or (iii) the second portion 160 when the voltage differential and/or the current differential of the second portion 160 is outside of the acceptable tolerance range.

At block 308, if a thermal hazard is present and/or was detected in the first section 132, the ECU 120 may initiate and/or perform a first section fault detection process at block 400, which may be configured to identify malfunctioning components and/or mitigate thermal hazards associated therewith. If a thermal hazard was not detected in the first section 132, the process may proceed to block 310.

At block 310, if a thermal hazard is present and/or was detected in the second section 140, the ECU 120 may initiate and/or perform a second section fault detection process at block 500, which may be configured to identify malfunctioning components and/or mitigate thermal hazards associated therewith. If a thermal hazard was not detected in the second section 140, the process may proceed to block 312.

At block 312, if a thermal hazard is present and/or was detected in the second portion 160, the ECU 120 may initiate and/or perform a second portion fault detection process at block 600, which may be configured to identify malfunctioning components and/or mitigate thermal hazards associated therewith. If a thermal hazard was not detected in the second portion 160, the process may proceed to block 314.

At block 314, the ECU 120 may, for example and without limitation, provide an indication of the hazard or fault, such as to a controller, another ECU, another electrical system, a vehicle system, a vehicle occupant, and/or a remote monitoring device/system, among others. The indication may include a message and/or signal that may communicate that a thermal hazard was present, that a thermal hazard was mitigated, that one or more of the electrical components 132, 142, 136, 138, 144, 146, 164, 172 is faulty and may need to be replaced, and/or that one or more systems and/or functions of the system 102 (and/or a vehicle 100) has been disabled, among other things.

Figure 4A:
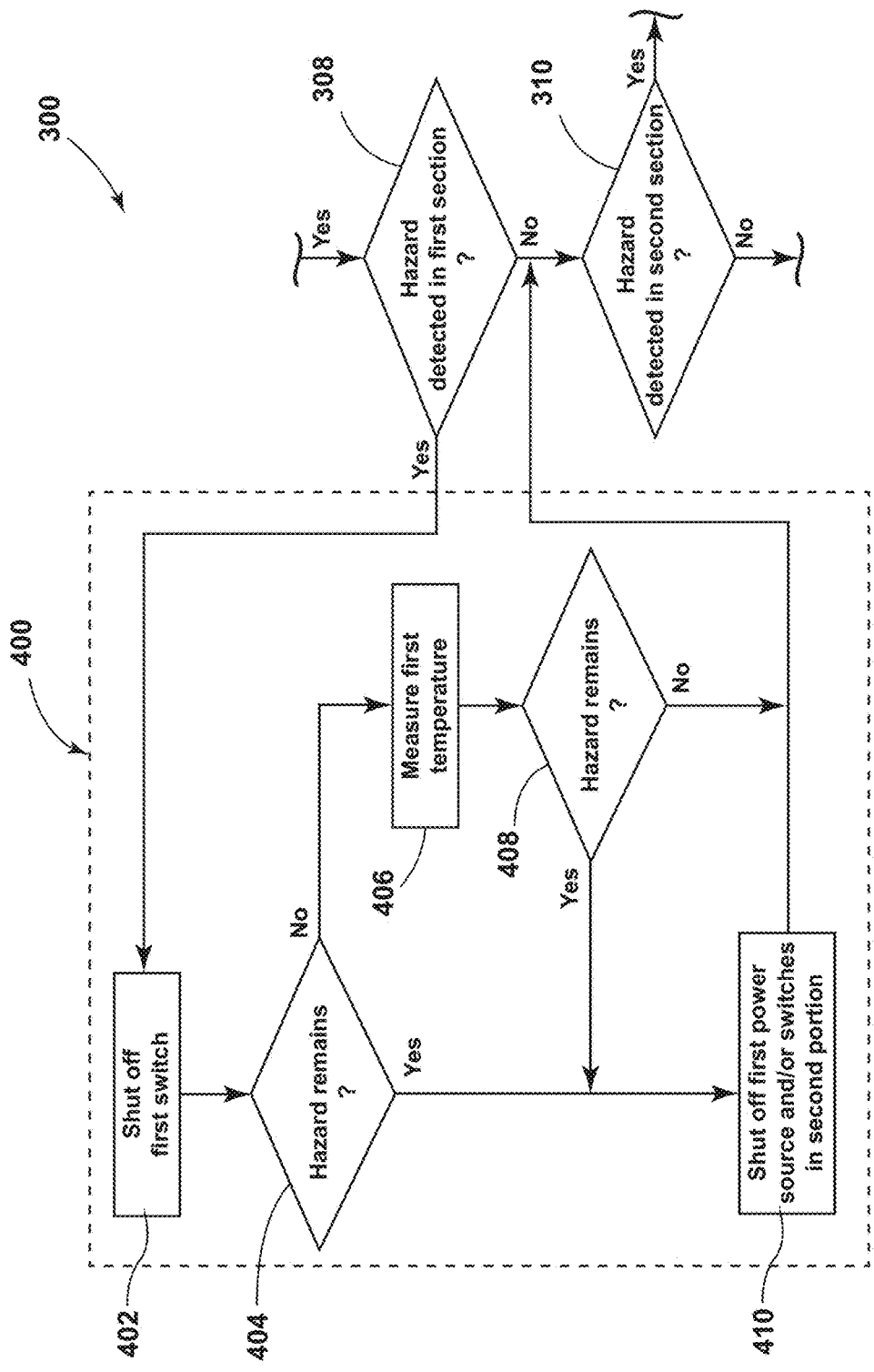
FIG. 4A is a flowchart generally illustrating a first embodiment of a first section fault detection process according to teachings of the present disclosure.
Figure 4B:
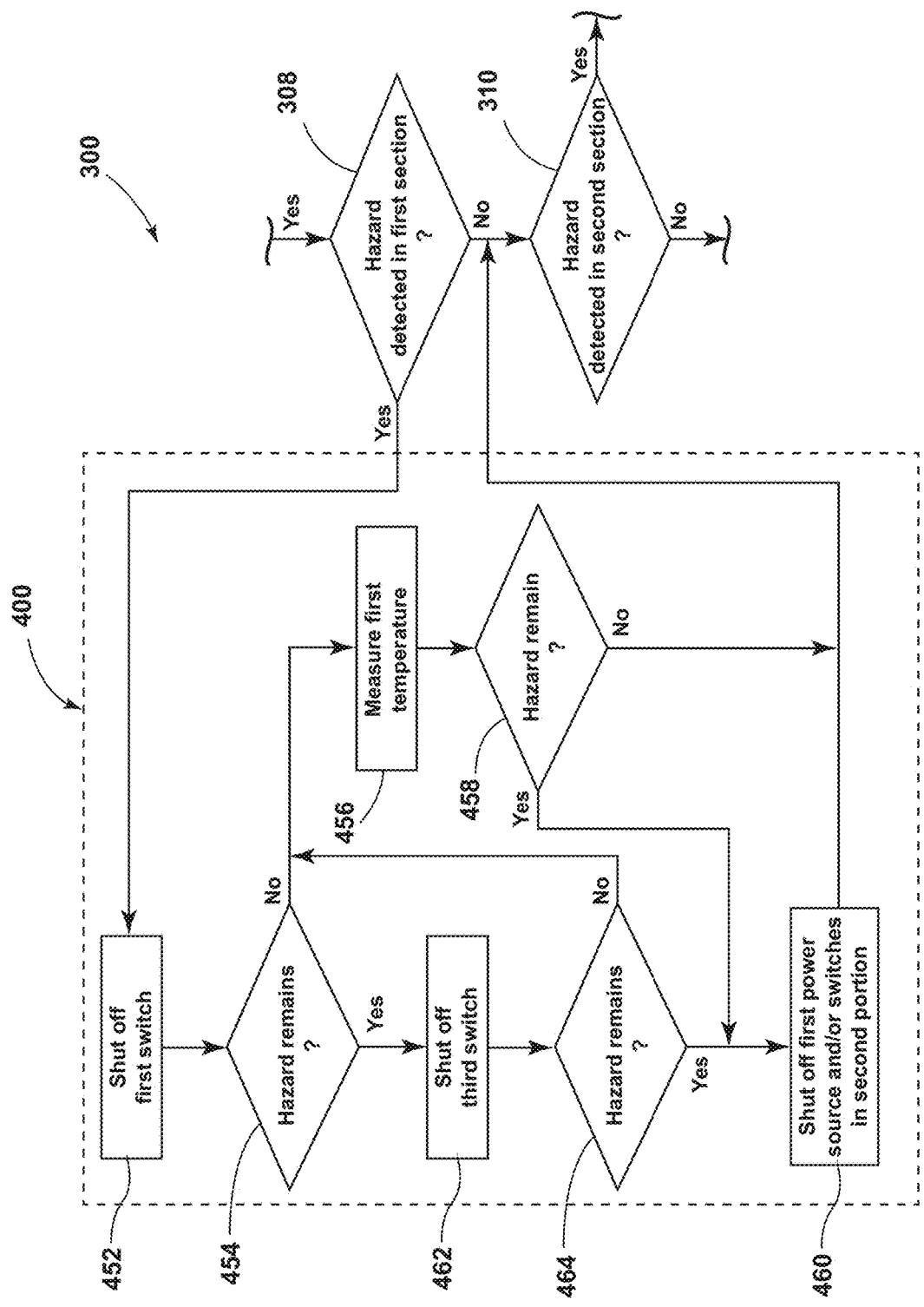
FIG. 4B is a flowchart generally illustrating a second embodiment of a first section fault detection process according to teachings of the present disclosure.

In embodiments, at block 400, the ECU 120 may initiate and/or perform a first section fault detection process. The process 400 may vary based on the configuration of the first section 132. For example, FIG. 4A generally illustrates an exemplary first section fault detection process 400 that may be conducted via the ECU 120 if the first section 132 includes the configuration generally illustrated in FIG. 1. Additionally or alternatively, with embodiments of the electrical system 102 that include a first section 132 with the configuration generally illustrated in FIG. 2, a first section fault detection process 400 may be conducted via the ECU 120 as generally illustrated in FIG. 4B.

If the first diode 134 is faulty and/or malfunctioning, the temperature of the first diode 134 may abnormally increase, which may cause a thermal hazard. As generally shown in FIG. 4A, in a first section fault detection process 400, the ECU 120 may shut off and/or disconnect the first switch 136 (e.g., control the first switch 136 to an open state) of the first section 132 at block 402. Shutting off the first switch 136 at block 402 may disrupt the electrical circuit of the first section 132, disconnecting/shutting off the power supplied to the first diode 134 by the first power source 106, and mitigate the thermal hazard in the first section 132 if the first diode 134 is faulty.

At block 404, the ECU 120 may determine if the thermal hazard is still present (e.g., after shutting off the first switch 136 and/or disconnecting the first diode 134). Determining if the thermal hazard is still present may include the voltage sensors 114 and/or the current sensors 116 remeasuring the voltage(s) and/or the current(s) originally measured at block 302. Additionally or alternatively, the ECU 120 may determine if the thermal hazard is still present in the first section 132 via a process similar to or generally the same as the process described above with respect to block 306 based on the remeasured voltage and/or the remeasured current of the first section 132. If the thermal hazard in the first section 132 does not remain and/or is no longer detected (e.g., the voltage differential and/or the current differential of the first section 132 is within the acceptable tolerance range), the ECU 120 may determine that the thermal hazard has been mitigated, that the first diode 134 may be faulty, and/or that a faulty first diode 134 likely caused the thermal hazard. The process may then proceed to blocks 406 and 408 to confirm that the thermal hazard in the first section 132 has been mitigated via the temperature sensor 118 as an added layer of protection. Alternatively, the process may skip blocks 406 and 408 and proceed directly to block 310 when the thermal hazard in the first section 132 does not remain and/or is no longer detected.

At block 406, the ECU 120 may measure a first temperature associated with one or more electrical components of the first section 132 (e.g., the first diode 134 and/or the first switch 136) via a temperature sensor 118. At block 408, the ECU 120 may compare the first temperature measured at block 406 to an acceptable temperature range to confirm whether the thermal risk in the first section 132 has been mitigated. If the ECU 120 confirms at block 408 that the thermal hazard in the first section 132 has been mitigated based on the measured first temperature (e.g., the measured first temperature is within the acceptable temperature range), the fault detection process 400 for the first section 132 may be complete and the method 300 may proceed to block 310. If the ECU 120 determines that the thermal hazard in the first section 132 has not been mitigated at block 408 (e.g., the measured first temperature is not within the acceptable temperature range), the ECU 120 may determine that the first diode 134 may not be faulty and/or that the first diode 134 may not have caused the thermal hazard, the ECU 120 may determine that the first switch 136 may be faulty, and/or the process 400 may proceed to block 410.

At block 404, when the ECU 120 determines that the thermal hazard in the first section 132 remains and/or is still detected (e.g., the voltage differential and/or the current differential of the first section 132 is not within the acceptable tolerance range), the ECU 120 may determine that the thermal hazard has not been mitigated, that the first switch 136 may also be faulty, and/or that a faulty first switch 136 may have caused the thermal hazard, and the process may proceed to block 410. For example and without limitation, if the ECU 120 attempts to open the first switch 136, but the first current is still detected (e.g., via a current sensor 116), the ECU 120 may determine that the first switch 136 is faulty and shut off the first power source 106, which may mitigate and/or eliminate the thermal hazard.

At block 410, the ECU 120 may shut off/disconnect the first power source 106 and/or all switches 164, 172 in the second portion 160 to mitigate the thermal hazard, thereby completing the fault detection process 400 in the first section 132 and the method 300 may advance to block 310 or directly to block 314. In embodiments, at block 410 the ECU 120 may first shut off the first power source 106, then confirm whether the thermal hazard has been mitigated by repeating the processes of blocks 406 and 408. If the thermal hazard was successfully mitigated by shutting off the first power source 106, the method 300 may proceed to block 310. If the thermal hazard was not successfully mitigated by shutting off the first power source 106, the ECU 120 may shut off all of the switches 164, 172 of the second portion 160 then repeat blocks 406 and 408 again. If the thermal hazard was successfully mitigated by shutting off all of the switches 164, 172 of the second portion 160, the method 300 may proceed to block 310. If the thermal hazard was not successfully mitigated by shutting off all of the switches 164, 172 of the second portion 160, the method may proceed directly to block 314 and/or the ECU 120 may shut down both power sources 106, 108.

In embodiments of the electrical system 102, such as the embodiment shown in FIG. 2, an alternate fault detection process may be performed on the first section 132 at block 400 as generally illustrated in FIG. 4B. At block 452, the ECU 120 may shut off and/or disconnect the first switch 136 of the first section 132 similarly to block 402. At block 454, the voltage sensors 114 and/or the current sensors 116 may remeasure the voltage(s) and/or the current(s) originally measured at block 302 and the ECU 120 may determine if the thermal hazard is still present in the first section 132 in a similar manner to block 404. If the thermal hazard in the first section 132 does not remain and/or is no longer detected (e.g., the voltage differential and/or the current differential of the first section 132 is within the acceptable tolerance range) at block 454, the ECU 120 may determine that the thermal hazard has been mitigated, that the first diode 134 may be faulty, and then may proceed to blocks 456 and 458. Alternatively, the process 400 may skip blocks 456 and 458 and proceed directly to block 310.

As described above with respect to blocks 406 and 408, the ECU 120 may measure a first temperature associated with one or more electrical components of the first section 132 (e.g., the first diode 134, the first switch 136, and/or the third switch 138) via the temperature sensor 118 at block 456 and analyze the measured first temperatures at block 458 to confirm that the thermal hazard in the first section 132 has been mitigated. If the ECU 120 confirms at block 458 that the thermal hazard in the first section 132 has been mitigated based on the measured first temperature (e.g., the measured first temperature is within the acceptable temperature range), the process 400 may proceed to block 310. If the ECU 120 determines that the thermal hazard in the first section 132 has not been mitigated at block 458 (e.g., the measured first temperature is not within the acceptable temperature range), the process 400 may proceed to block 460.

At block 454, if the ECU 120 determines that the thermal hazard in the first section 132 remains and/or is still detected after shutting off the first switch 136 at block 452 (e.g., the voltage differential and/or the current differential of the first section 132 is not within the acceptable tolerance range), the ECU 120 may determine that the thermal hazard has not been mitigated and the process 400 may proceed to block 462.

In embodiments, in the same or a similar manner described above with respect to blocks 452 and 454 for the first switch 136, the ECU 120 may shut off and/or disconnect the third switch 138 at block 462 and the voltage(s) and/or the current(s) originally measured at block 302 may be remeasured and analyzed at block 464 to determine if the thermal hazard is still present in the first section 132. If the thermal hazard in the first section 132 does not remain and/or is no longer detected at block 464, the ECU 120 may determine that the thermal hazard has been mitigated, that the first diode 134 and/or the first switch 136 may be faulty, and may then repeat blocks 456 and 458 to confirm that the thermal hazard in the first section 132 has been mitigated or, alternatively, may proceed directly to block 310. At block 464, if the ECU 120 determines that the thermal hazard in the first section 132 remains and/or is still detected, the ECU 120 may determine that the thermal hazard has not been mitigated, that the first diode 134, the first switch 136, and/or the third switch 138 may be faulty and may have caused the thermal hazard, and the process 400 may proceed to block 460. If the ECU 120 attempts to switch off (e.g., open) both switches 136, 138 and current is still detected (e.g., via a current sensor 116 connected to the first section 132), the ECU 120 may determine that both switches 136, 138 are faulty.

With embodiments, at block 460, the ECU 120 may shut off/disconnect the first power source 106 and/or all switches 164, 172 in the second portion 160 to mitigate the thermal hazard, which may complete the fault detection process 400 in the first section 132 and allow the process to advance to block 310. In embodiments, block 460 may be the same as block 410.

In embodiments, at block 500, the ECU 120 may initiate and/or perform a fault detection process for the second section 140. The steps of the fault detection process 500 may vary based on the configuration of the second section 140. For example, FIG. 5A generally illustrates an exemplary fault detection process that may be performed via the ECU 120 for the second section 140 of the electrical system 102 depicted in FIG. 1. With some embodiments of the electrical system 102, such as generally depicted in FIG. 2, a variation of the fault detection process 500 as shown in FIG. 5B may be performed for the second section 140.

Figure 5A:
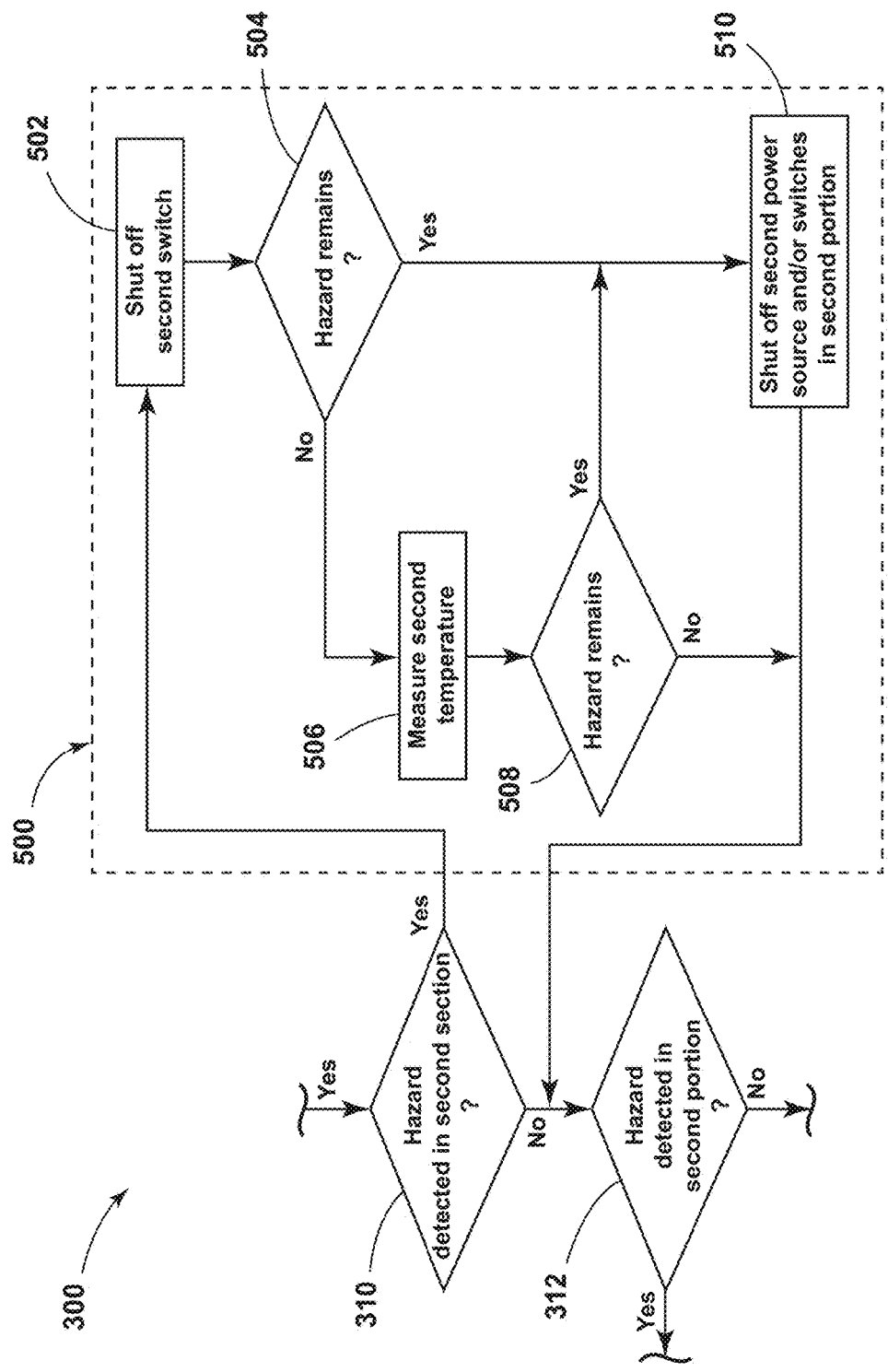
FIG. 5A is a flowchart generally illustrating a first embodiment of a second section fault detection process according to teachings of the present disclosure.

With embodiments, a fault detection process 500 performed for the second section 140, as generally shown in FIG. 5A, may include blocks 502, 504, 506, 508, 510. Blocks 502, 504, 506, 508, 510 may involve the same or similar processes of blocks 402, 404, 406, 408, 410 described with respect to FIG. 4A performed on the corresponding components of the second section 140 (e.g., second diode 142 and second switch 144) and, for brevity, are not described in detail. For example, like process 400, process 500 may include the ECU 120 disconnecting the second diode 142 by opening the second switch 144, remeasuring the current and/or voltage, and/or obtaining a second temperature associated with one or more electrical components of the second section 140 (e.g., the second diode 142 and/or the second switch 144), such as to determine if the second diode 142 and/or the second switch 144 are faulty, and then mitigating the risk of a thermal hazard.

Figure 5B:
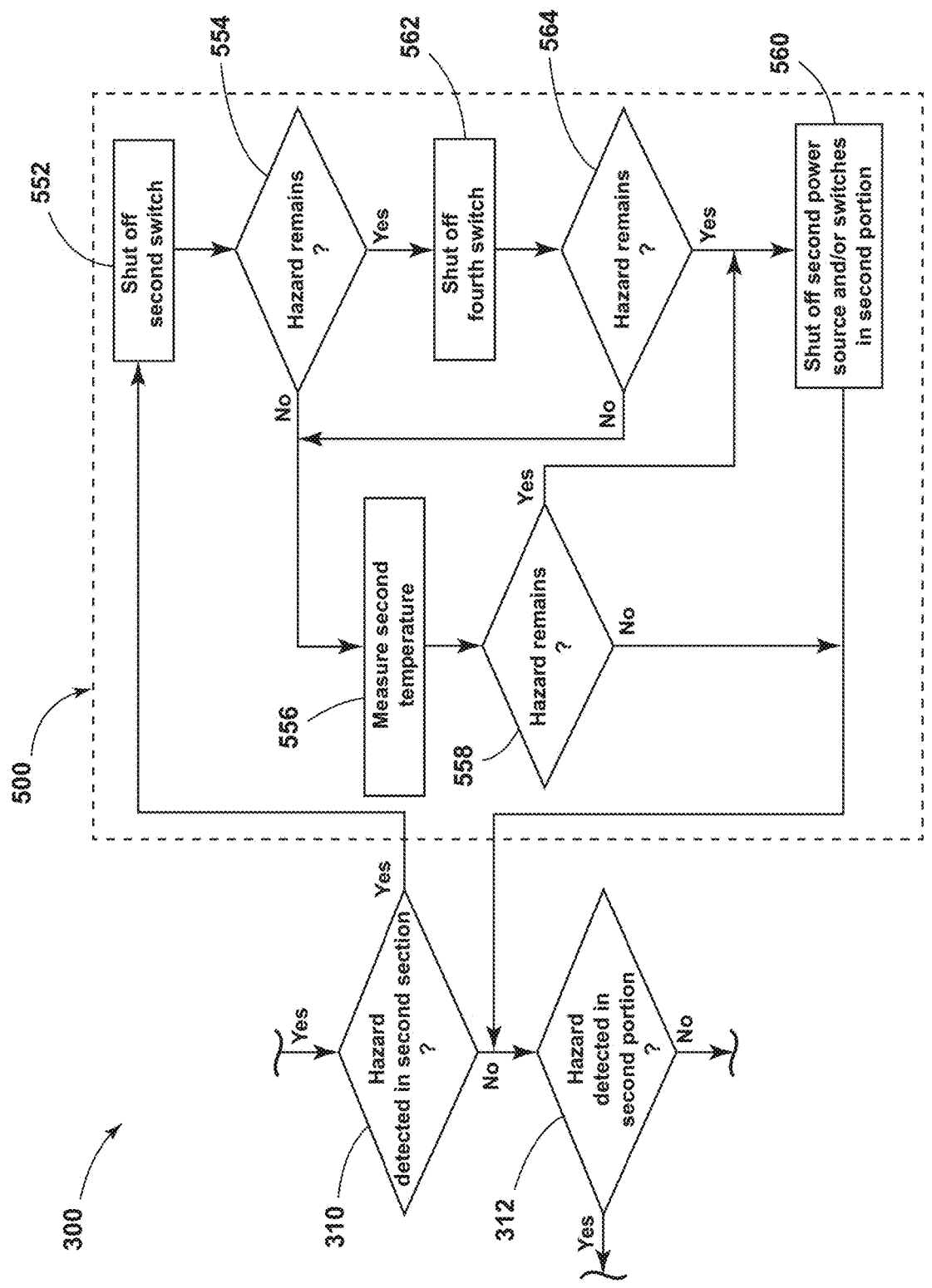
FIG. 5B is a flowchart generally illustrating a second embodiment of a second section fault detection process according to teachings of the present disclosure.

A fault detection process performed on the second section 140 at block 500, as generally shown in FIG. 5B, may include blocks 552, 554, 556, 558, 560, 562, 564. Blocks 552, 554, 556, 558, 560, 562, 564 may involve the same or similar process of blocks 452, 454, 456, 458, 460, 462, 464 described with respect to FIG. 4B performed on the corresponding components (e.g., second diode 142, second switch 144, fourth switch 146) of the second section 140 and, for brevity, are not described in detail. For example, like process 400, process 500 may include the ECU 120 disconnecting the second diode 142 by opening the second switch 144, remeasuring current and/or voltage, obtaining a second temperature associated with one or more electrical components of the second section 140 (e.g., the second diode 142, the second switch 144, and/or the fourth switch 146), opening the fourth switch 146, remeasuring the current and/or voltage, obtaining the second temperature, such as to determine if the second diode 142, the second switch 144, and/or the fourth switch 146 are faulty, and then mitigating the risk of a thermal hazard.

With embodiments, including a third switch 138 and/or a fourth switch 146 may allow for power to be provided from at least one of the power sources 106, 108 even if a diode and one of switches of a section 132, 140 fails. For example, if the first diode 134 and/or one of the switches 136, 138 fails, the ECU 120 may turn off (e.g., open) the other switch 136, 138 and may continue to operate the second section 140 to provide power to both loads 110, 112. If the second diode 142 and/or one of the switches 144, 146 fails, the ECU 120 may turn off the other switch 144, 146, and may continue to operate the first section 132 to provide power to both loads 110, 112. With such a configuration, the electrical system 102 may remain at least partially operational, even in the event of the failure of a switch 136, 138, 144, 146 and a diode 134, 142.

At block 600, the ECU 120 may initiate and/or perform a fault detection process on the second portion 160. The steps of the fault detection process may vary based on the configuration of the second portion 160. For example, FIG. 6 generally illustrates an exemplary fault detection process that may be performed on the second portion 160 of the electrical system 102 depicted in FIG. 1.

Figure 6:
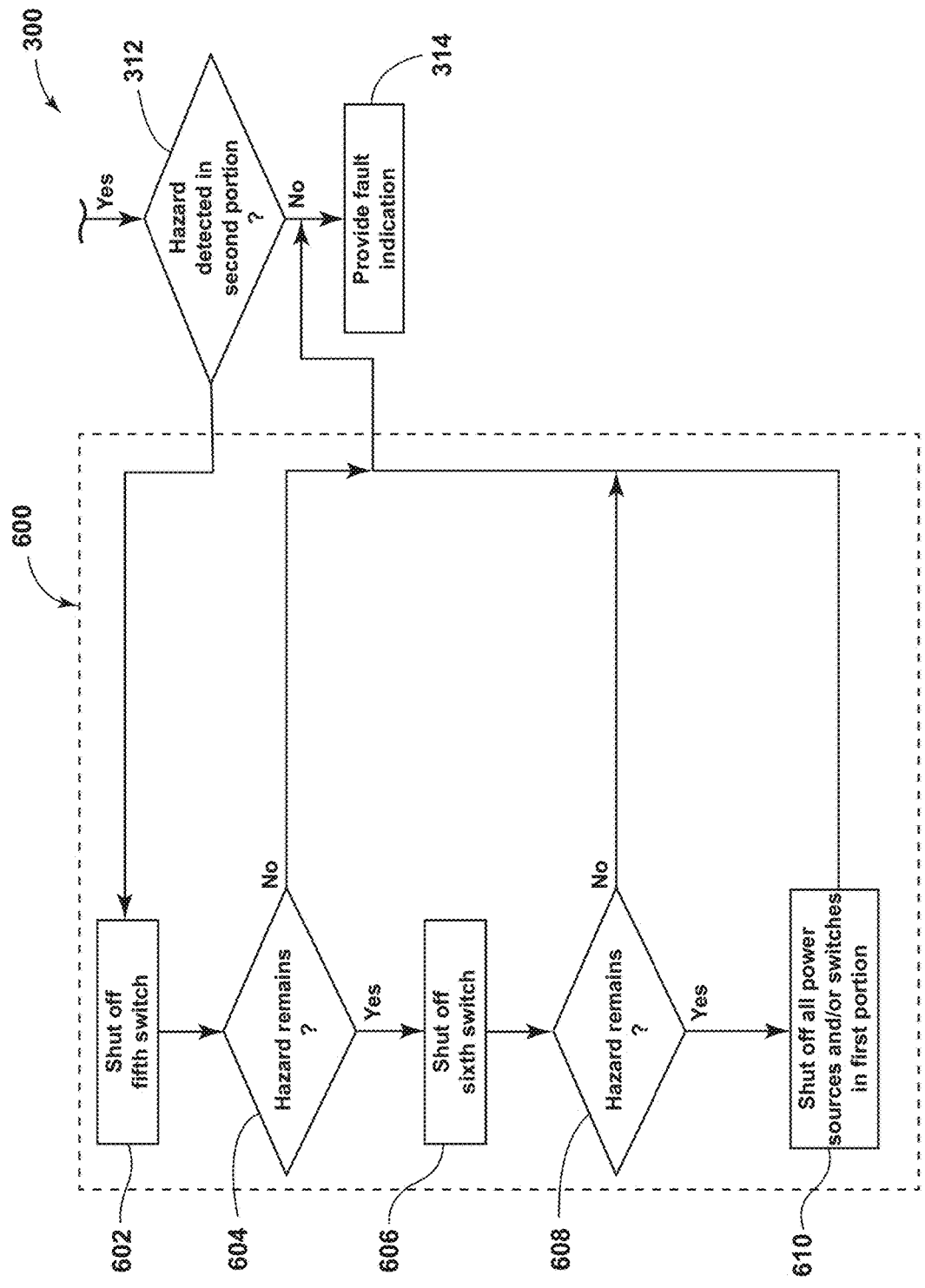
FIG. 6 is a flowchart generally illustrating an embodiment of a second portion fault detection process according to teachings of the present disclosure.

As generally shown in FIG. 6, in a fault detection process 600 performed on the second portion 160, the ECU 120 may shut off and/or disconnect the fifth switch 164 of the first distribution section 162 at block 602. At block 604, a temperature sensor 118 may measure a first distribution temperature associated with the fifth switch 164 and the ECU 120 may analyze the measured temperature (e.g., compare the measured first distribution temperature to an acceptable temperature range) to confirm whether the thermal hazard is still present in the second portion 160. If the thermal hazard in the second portion 160 does not remain and/or is no longer detected (e.g., the measured first distribution temperature is within the acceptable temperature range), the ECU 120 may determine that the thermal hazard has been mitigated and may proceed to block 314. At block 604, if the ECU 120 determines that the thermal hazard in the second portion 160 remains and/or is still detected (e.g., the measured first distribution temperature is not within the acceptable temperature range), the ECU 120 may determine that the thermal hazard has not been mitigated and the process 600 may proceed to block 606.

At block 606, the ECU 120 may shut off and/or disconnect the sixth switch 172 of the second distribution section 170. At block 608, a temperature sensor 118 may measure a second distribution temperature associated with the sixth switch 172 and the ECU 120 may analyze the measured second distribution temperature (e.g., compare the measured second distribution temperature to an acceptable temperature range) to confirm whether the thermal hazard is still present in the second portion 160. If the thermal hazard in the second portion 160 does not remain and/or is no longer detected (e.g., the measured second distribution temperature is within the acceptable temperature range), the ECU 120 may determine that the thermal hazard has been mitigated and may proceed to block 314. At block 608, if the ECU 120 determines that the thermal hazard in the second portion 160 remains and/or is still detected (e.g., the measured second distribution temperature is not within the acceptable temperature range), the ECU 120 may determine that the thermal hazard has not been mitigated and the process 600 may proceed to block 610.

At block 610, the ECU 120 may shut off/disconnect both the first power source 106 and the second power source 108 and/or all switches 136, 138, 144, 146 in the first portion 130 to mitigate the thermal hazard, thereby completing the fault detection process 600 in the second portion 160 and the process 300 may advance to block 314. In examples, block 610 may include shutting off all of the switches 136, 138, 144, 146 in the first portion 130, remeasuring the voltage(s) and/or the current(s) originally measured at block 302, and then, if the thermal hazard has not been mitigated, shutting off the first power source 106 and the second power source 108.

As operating electrical components at a voltage and/or a current outside of the acceptable threshold for a period of time may cause a component to overheat, utilizing the voltage and/or the current to determine if a thermal hazard is present may allow the ECU 120 to detect and react to potential thermal hazards faster than using temperature sensors 118 alone (e.g., before the temperature of a component exceeds an acceptable temperature range, such as detected via the temperature sensors 118).

In examples, an ECU may include an electronic controller and/or include an electronic processor, such as a programmable microprocessor and/or microcontroller. In embodiments, an ECU may include, for example, an application specific integrated circuit (ASIC). An ECU may include a central processing unit (CPU), a memory (e.g., a non-transitory computer-readable storage medium), and/or an input/output (I/O) interface. An ECU may be configured to perform various functions, including those described in greater detail herein, with appropriate programming instructions and/or code embodied in software, hardware, and/or other medium. In embodiments, an ECU may include a plurality of controllers. In embodiments, an ECU may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical system, comprising:
a power distribution circuit, including:
a first portion configured to combine a first power input and a second power input into a combined power output; and
a second portion configured to provide power from the combined power output to a plurality of loads; and
an electronic control unit (ECU) connected to the power distribution circuit;
wherein the first portion of the power distribution circuit includes a first section, a second section, and an output section, the output section connected to the second portion to provide the combined power output to the second portion;
wherein the first section, the second section, and the output section are connected to one another such that the first section and the second section are connected in parallel to the output section;
wherein the first section includes a first semiconductor device and a first switch disposed in series;
wherein the second section includes a second semiconductor device and a second switch disposed in series; and
wherein the ECU is configured to control the power distribution circuit to detect and mitigate a thermal hazard in the power distribution circuit.

2. The electrical system of claim 1, wherein the second portion includes:
a first distribution section connected to a first load of the plurality of loads;
the first distribution section includes a first distribution switch;
a second distribution section connected to a second load of the plurality of loads;
the second distribution section includes a second distribution switch; and
an input section connected to the output section to receive the combined power output from the output section.

3. The electrical system of claim 2, wherein:
the first switch is connected to an output of the first semiconductor device;
the second switch is connected to an output of the second semiconductor device; and
outputs of the first switch and the second switch are connected to the output section.

4. The electrical system of claim 3, including one or more voltage sensors configured to detect a first voltage of the first section, a second voltage of the second section, and a third voltage of the output section.

5. The electrical system of claim 4, including one or more current sensors configured to detect a first current of the first section, a second current of the second section, a first distribution current of the first distribution section, and a second distribution current of the second distribution section.

6. The electrical system of claim 5, including one or more temperature sensors configured to detect:
a first temperature associated with the first section;
a second temperature associated with the second section;
a first distribution temperature associated with the first distribution section; and
a second distribution temperature associated with the second distribution section.

7. The electrical system of claim 6, wherein:
the ECU is connected to the one or more voltage sensors, the one or more current sensors, and the one or more temperature sensors; and
the ECU is configured to:
detect the thermal hazard in the power distribution circuit according to the first voltage, the second voltage, the third voltage, the first current, the second current, the first distribution current, the second distribution current, the first temperature, the second temperature, the first distribution temperature, and the second distribution temperature;
shut off the first switch and provide power from the second section to the first distribution section and the second distribution section if the thermal hazard is detected in the first section; and
shut off the second switch and provide power from the first section to the first distribution section and the second distribution section if the thermal hazard is detected in the second section.

8. The electrical system of claim 7, wherein the ECU is configured to:
shut off the first distribution switch and the second distribution switch if the thermal hazard is associated with the first switch or the second switch; and
shut off the first switch and the second switch if the thermal hazard is detected in the first distribution section or the second distribution section.

9. The electrical system of claim 6, wherein:
the first section includes a third switch; and
the second section includes a fourth switch.

10. The electrical system of claim 9, wherein:
the ECU is connected to the one or more voltage sensors, the one or more current sensors, and the one or more temperature sensors; and
the ECU is configured to:
detect the thermal hazard in the power distribution circuit according to the first voltage, the second voltage, the third voltage, the first current, the second current, the first distribution current, the second distribution current, the first temperature, the second temperature, the first distribution temperature, and the second distribution temperature;
shut off the third switch and provide power from the second section to the first distribution section and the second distribution section if the thermal hazard is detected in the first section;
shut off the fourth switch and provide power from the first section to the first distribution section and the second distribution section if the thermal hazard is detected in the second section; and
shut off the first switch and the second switch if the thermal hazard is detected in the first distribution section or the second distribution section.

11. A method of operating an electrical system, the electrical system including a power distribution circuit having a first portion and a second portion, the first portion including a first section having a first semiconductor device and a first switch, a second section having a second semiconductor device and a second switch, and a output section configured to provide a combined power output from the first section and the second section to the second portion, and the second portion including a first distribution section and a second distribution section, the method comprising:
measuring a first current of the first section and a second current of the second section;
determining an expected first current of the first section and an expected second current of the second section;
determining whether a thermal hazard is present in at least one of the first section and the second section based on the measured first current, the expected first current, the measured second current, and the expected second current; and
mitigating the thermal hazard.

12. The method of claim 11, wherein mitigating the thermal hazard includes:
shutting off the first switch when the thermal hazard is associated with the first semiconductor device; and
shutting off the second switch when the thermal hazard is associated with the second semiconductor device.

13. The method of claim 12, including:
remeasuring the first current and the second current after shutting off the first switch or the second switch; and
determining whether the thermal hazard is still present based on the remeasured first current and the remeasured second current.

14. The method of claim 13, wherein mitigating the thermal hazard includes:
shutting off a first power source connected to the first section when the first switch is shut off and the remeasured first current is greater than zero; and
shutting off a second power source connected to the second section when the second switch is shut off and the remeasured second current is greater than zero.

15. The method of claim 11, wherein:
determining whether the thermal hazard is present includes determining whether the thermal hazard is present in the second portion of the power distribution circuit; and
mitigating the thermal hazard includes shutting off both the first switch and the second switch when the thermal hazard is present in the second portion.

16. The method of claim 15, wherein:
the first distribution section includes a first distribution switch;
the second distribution section includes a second distribution switch; and
determining whether the thermal hazard is present in the second portion includes:
sensing a first distribution temperature of the first distribution switch; and
comparing the first distribution temperature to an expected first distribution temperature.

17. The method of claim 11, wherein determining whether the thermal hazard is present includes:
determining if the thermal hazard is present in the first section via comparing the measured first current and the expected first current; and
determining if the thermal hazard is present in the second section via comparing the measured second current and the expected second current.

18. The method of claim 11, including:
measuring a first voltage of the first section, a second voltage of the second section, and an output voltage of the output section; and
calculating an expected output voltage of the output section;
wherein determining whether the thermal hazard is present includes determining if a voltage differential of the measured output voltage and the expected output voltage is above a threshold.

19. The method of claim 11, wherein:
the first section includes a third switch;
the second section includes a fourth switch;
mitigating the thermal hazard includes shutting off at least one of the first switch and the third switch when the thermal hazard is present in the first section; and
mitigating the thermal hazard includes shutting off at least one of the second switch and the fourth switch when the thermal hazard is present in the second section.

20. The method of claim 19, wherein mitigating the thermal hazard includes:
remeasuring the first current and the second current; and
determining whether the thermal hazard is still present based on the remeasured first current and the remeasured second current;
shutting off the third switch when the first switch is shut off and the remeasured first current is greater than zero;
shutting off the first switch when the third switch is shut off and the remeasured first current is greater than zero;
shutting off the fourth switch when the second switch is shut off and the remeasured second current is greater than zero;
shutting off the second switch when the fourth switch is shut off and the remeasured second current is greater than zero;
shutting off a first power source connected to the first section when the first switch and the third switch are shut off and the remeasured first current is greater than zero; and
shutting off a second power source connected to the second section when the second switch and the fourth switch are shut off and the remeasured second current is greater than zero.

* * * * *